(12) United States Patent
Umemoto et al.

(10) Patent No.: US 6,949,917 B2
(45) Date of Patent: *Sep. 27, 2005

(54) SWITCHING POWER SUPPLY UNIT

(75) Inventors: Kiyotaka Umemoto, Kyoto (JP); Ko Takemura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/948,001

(22) Filed: Sep. 23, 2004

(65) Prior Publication Data

US 2005/0040801 A1 Feb. 24, 2005

Related U.S. Application Data

(63) Continuation of application No. 10/414,648, filed on Apr. 16, 2003, now Pat. No. 6,815,939.

(30) Foreign Application Priority Data

Apr. 24, 2002 (JP) ...................................... 2002-122534

(51) Int. Cl.[7] .............................................. G05F 1/56
(52) U.S. Cl. ..................................... 323/286; 323/271
(58) Field of Search ................................ 323/271, 282, 323/285, 286

(56) References Cited

U.S. PATENT DOCUMENTS

| 5,345,165 | A | 9/1994 | Froeschle | .................... 323/284 |
|---|---|---|---|---|
| 6,040,686 | A | 3/2000 | Schenkel | ..................... 323/282 |
| 6,163,143 | A | 12/2000 | Shimamori | .................. 323/284 |
| 6,329,801 | B1 | 12/2001 | Zuniga et al. | .............. 323/285 |
| 6,348,780 | B1 | 2/2002 | Grant | .......................... 323/222 |
| 6,396,252 | B1 | 5/2002 | Culpepper et al. | .......... 323/285 |

FOREIGN PATENT DOCUMENTS

| JP | 06-303766 | 10/1994 | .......... H02M/3/155 |
|---|---|---|---|
| JP | 10-225105 | 8/1998 | .......... H02M/3/155 |
| JP | 10-313572 | 11/1998 | .......... H02M/3/155 |
| JP | 2000-032744 | 1/2000 | .......... H02M/3/155 |
| JP | 2001-309645 | 11/2001 | .......... H02M/3/155 |

*Primary Examiner*—Jeffrey Sterrett
(74) *Attorney, Agent, or Firm*—Hogan & Hartson LLP

(57) ABSTRACT

A switching power supply unit generates a pulse signal having a duty factor based on the voltage associated with the difference between a reference voltage and the output voltage of the unit, and the voltage associated with the current flowing through a smoothing coil. Upon receipt of the pulse signal and a light-load determination signal, a delay-control unit of the power supply unit outputs as an instruction signal supplied to the switching circuit the pulse signal as it is when the light-load determination signal indicates that the load is not light, but otherwise outputs the pulse signal after delaying and widening the pulse width thereof. Thus, when the load is light, the switching power supply unit may hold its switching frequency substantially low and constant without rendering the frequency bursting discontinuously.

18 Claims, 9 Drawing Sheets

SWITCHING POWER SUPPLY UNIT

This is a continuation of application Ser. No. 10/414,648 filed Apr. 16, 2003, now U.S. Pat. No. 6,815,939 which application is hereby incorporated by reference in its entirety.

FIELD OF THE INVENTION

The invention relates to a switching power supply unit having an improved power supply efficiency when operating under a light load.

BACKGROUND OF THE INVENTION

A switching power supply unit controls electric power that provides to a load by turning on and off a switch (e.g. power transistor) connected in series or parallel with the load. Such switching power supply unit uses a smoothing coil and an output condenser in order to stabilize a load current.

The duty factor of the switch controlling the supply of electric power to the load is changed by, for example, regulating the period (or pulse width) of the on-state pulses while fixing the frequency of the pulses.

Switching power supply units are in general more efficient than series power supply units. However, the efficiency of a switching power supply unit depends on the magnitude of the output current. The efficiency goes down with the output current for a small or light load. The lowering of the efficiency is mainly due to the power loss accompanying the switching operation of the power supply unit. The loss is called switching loss.

Therefore, in order to reduce the switching loss of a switching power supply unit under a light load, the unit is harnessed by a burst mode control or a skip mode control.

In the burst mode control, when the output current is detected to be sufficiently small, the power is cut off over a period while an output condenser can substantially sustain a predetermined output voltage, as taught in Japanese Patent Early Publication H-06-303766. That is, on-off switching periods in which power bursts and off-periods alternate. During the off-periods, no switching loss takes place, so that the efficiency is improved accordingly.

In a skip-mode control, a window having a fixed voltage width is applied to the output voltage by a window comparator. In this case, the power supply unit is switched with pulses having a fixed duty factor while raising the output voltage from the lower limit to the upper limit of the window. However, the output voltage is left freely falling from the upper limit to the lower limit. The efficiency is improved while the output voltage is falling from the upper limit to the lower limit, since no switching loss is involved then.

However, under a burst-mode control, burst noises are generated in such conventional switching power supply unit as the unit undergoes a transition from an on-off period to an off-period due to the fact that the switching frequency changes discontinuously in the transition. The burst noise gives adverse effects to the surrounding electronic devices, and can result in mutual interference among them.

A switching power supply unit also results in bursts of output power in a skip-mode control because on-off switching is performed only when the output voltage is raised from the lower limit to the upper limit. Besides, large ripples result in the varying output voltage. Such large ripples in the output voltage are unfavorable for the load.

SUMMARY OF THE INVENTION

It is, therefore, an object of the invention to provide an improved switching power supply unit capable of holding the switching frequency substantially constant at a low frequency to prevent the switching frequency from discontinuously changing and to suppress ripples in the output voltage when the load is light, thereby resulting in only a limited power loss for the light load.

In accordance with one aspect of the invention, there is provided a switching power supply unit, comprising:

a switching circuit for switching on and off an input voltage in response to an instruction signal received;

a smoothing coil connected to the output end of the switching circuit for smoothing the switching output of the switching circuit;

an output condenser connected to the output end of the smoothing coil and charged to the output voltage of the power supply unit, a pulse signal generator for generating a periodic pulse signal having a duty factor in accord with the difference between a reference voltage and a feedback voltage associated with the output voltage; and a delay-control unit receiving the pulse signal from the pulse signal generator and a light-load determination signal indicating whether the load connected to the switching power supply unit is light or not to output as the pulse signal the instruction signal as it is when the load of the power supply unit is not light, but otherwise output the pulse signal after widening the pulse width thereof.

In accordance with another aspect of the invention, there is provided a switching power supply unit, comprising:

a switching circuit for switching on and off an input voltage in response to an instruction signal received;

a smoothing coil connected to the output end of the switching circuit for smoothing the switching output of the switching circuit;

an output condenser connected to the output end of the smoothing coil and charged to the output voltage of the power supply unit, a pulse signal generator for generating a first periodic pulse signal having a duty factor in accord with the difference between a reference voltage and the feedback voltage representing the output voltage; and a signal-thinning control unit receiving the first periodic pulse signal from the pulse signal generator and a light-load determination signal indicating whether the load connected to the switching power supply unit is light or not to output as the instruction signal the first periodic pulse signal when the load of the power supply unit is not light, but otherwise output a second periodic pulse signal that are generated by thinning the first periodic pulse signal.

With a switching power supply unit of the invention, the switching frequency of the unit is held substantially constant at a low frequency when the load is light, thereby reducing the power loss and improving the efficiency of the unit during a light-load period. In addition, burst noise substantially disappear, and hence ripple of the output voltage, may be reduced negligibly small as compared with conventional ones.

DETAILED DESCRIPTION OF THE PREFERRED EMBODIMENTS

Referring to FIGS. 1–5, a first embodiment of a switching power supply unit of the invention will now be described.

Figure 1:
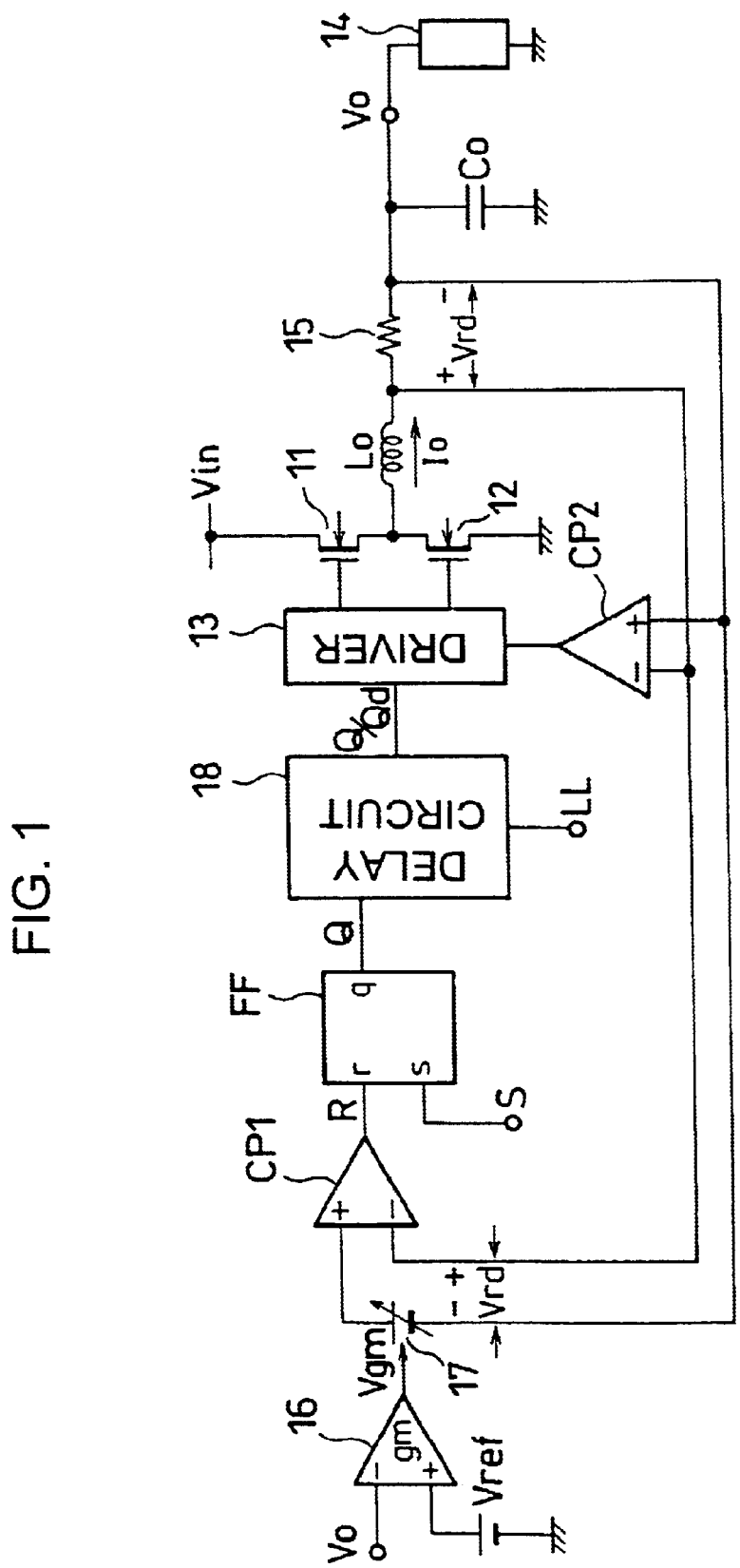
FIG. 1 is an overall schematic view of a switching power supply unit according to a first embodiment of the invention.

As shown in FIG. 1, the switching power supply unit is formed as a current-control mode unit. An n-type MOS transistor 11 (referred to as n-type transistor) and another n-type transistor 12 connected in series between an input voltage Vin and the ground together form a switching circuit. The switching circuit is supplied with a driving pulse from a driver 13 and generally complementarily turns on and off the n-type transistors 11 and 12. A smoothing coil Lo smoothes the output of the switching circuit. An output condenser Co smoothes the output voltage Vo of the unit in collaboration with a smoothing coil Lo. The input voltage Vin is stepped down to the output voltage Vo in accordance with the pulse width of a given drive pulse. The output condenser Co is charged with the output voltage Vo. This output voltage Vo is supplied to a load 14. A resistor 15 is provided to detect a current Io that flows through the smoothing coil Lo in terms of the voltage drop across the coil Lo (the voltage drop will be referred to as detection voltage Vrd).

A mutual-conductance amplifier 16 (hereinafter referred to as GM amplifier) is fed the output voltage Vo and a reference voltage Vref and generates, in accord with the difference between them, a current at its output terminal (the current referred to as output current). A GM amplifier output source 17 generates a GM output voltage Vgm in accord with the output current of the GM amplifier 16. A comparator CP1 compares the GM output voltage Vgm with the detection voltage Vrd to generate an output (referred to as comparison output).

A flip-flop FF receives at its set terminal s a setting signal S having a constant period, and at the reset terminal r thereof the comparison output of the comparator CP1 as a reset signal R. The flip-flop FF is reset at the rising edge of a reset signal R, and set at the falling edge of a set signal S while the reset signal R has been raised. The flip-flop FF outputs a pulse signal Q as it is set and reset.

The pulse signal Q of the flip-flop FF is supplied to a delay circuit 18, which circuit is adapted to output the pulse signal Q as it is or after it is widened in pulse width and delayed by a predetermined delay time (the delayed signal referred to as delayed pulse signal Qd), depending on whether or not a light-load determination signal LL is received. When the load is light as indicated by the light-load determination signal LL, a delay pulse signal Qd is outputted, but otherwise the pulse signal Q is outputted as it is. The output of the delay circuit 18 serves as an instruction signal to the driver 13.

Figure 2:
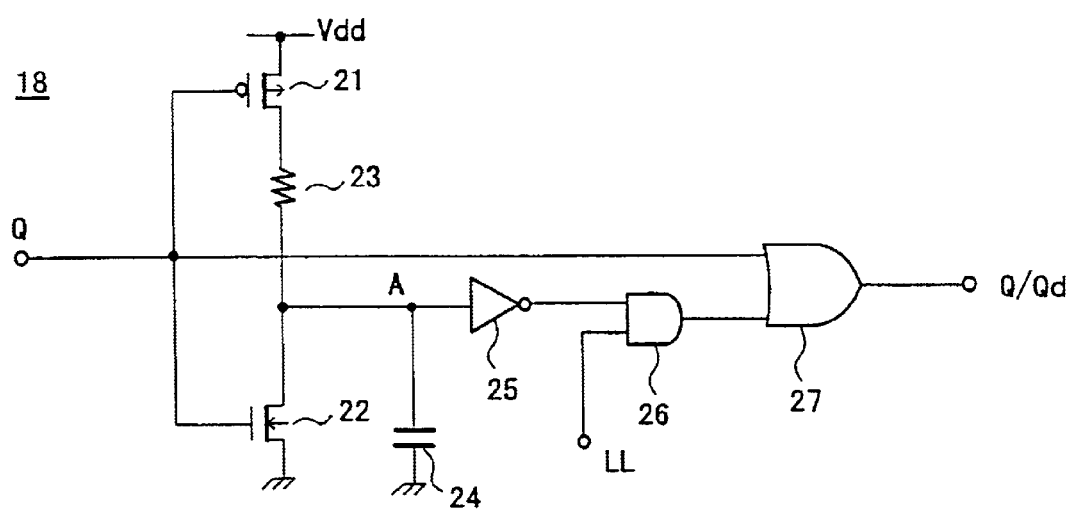
FIG. 2 is a circuit diagram of a delay circuit 18.
Figure 3:
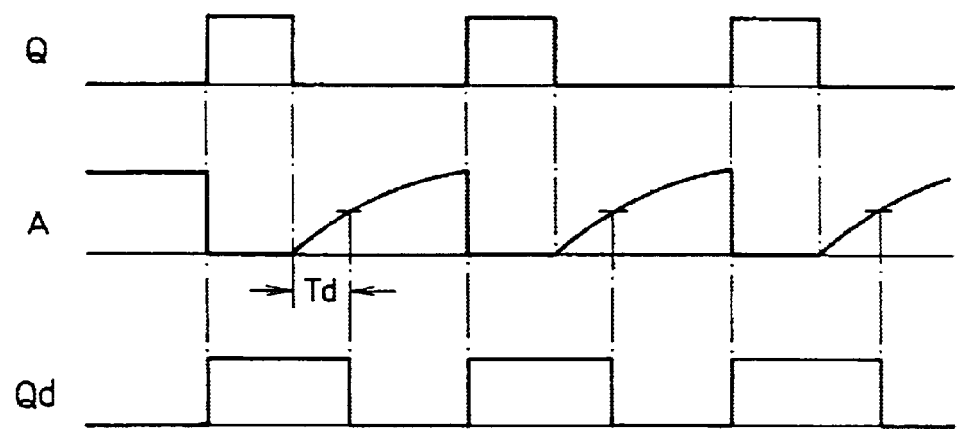
FIG. 3 is a timing diagram of the delay circuit 18.

FIG. 2 shows an exemplary delay circuit 18. FIG. 3 shows a timing diagram of the delay circuit. As shown in FIG. 2, a p-type transistor 21, a resistor 23, an n-type transistor 22 are connected in series. A condenser 24 is connected in parallel with the n-type transistor 22. It is determined if the charging voltage of the condenser 24 has reached a given threshold voltage Vth of the input (referred to as input threshold) to an inverter 25. To do this, a logical product of the output of the inverter 25 and the light-load determination signal LL is calculated by an AND circuit 26. An OR circuit 27 performs a logical sum operation on the output of the AND circuit 26 and the pulse signal Q to generate an instruction signal to the driver 13.

The pulse signal Q is applied to the gates of the p-type MOS transistor 21 (referred to as p-type transistor) and the n-type transistor 22. As the pulse signal Q goes down from a HIGH level to a LOW level, the condenser 24 is charged by a source voltage Vdd. The charging voltage of the condenser 24 rises with a time constant defined by the resistance of the resistor 23 and the capacitance of the condenser 24 as shown in FIG. 3. The inverter 25 is inverted at the moment the charging voltage reached the input threshold Vth of the inverter 25. If so, then the pulse signal Q is delayed to generate at the output end of the inverter 25 a delayed pulse signal Qd having a pulse width increased by time Td. Thus, depending on whether or not a light-load determination signal LL exists, either a pulse signal Q or a delayed pulse signal Qd is outputted.

Referring back to FIG. 1, a comparator CP2 is supplied with a detection voltage Vrd proportional to the current Io flowing through the smoothing coil Lo to determine the direction (polarity) of the current Io, and provides the driver 13 with a backflow detection signal. In the event that the current Io is a backflow, the driver 13 will turn off the n-type transistor 12 to stop the backflow through it.

The light-load determination signal LL can be generated when the mean of the detected voltages Vrd, for example, associated with the current Io does not exceeds a predetermined level. Alternatively, light-load determination signal LL may be generated upon detection of, for example, a backflow Io by the comparator CP2 a number of times. Furthermore, since the output of the GM amplifier 16 is substantially the current Io, the light-load determination signal LL may be generated when, the voltage according to its output, for example the GM output voltage Vgm, falls below a predetermined level. Any way, the light-load determination signal LL can be easily formed.

Referring also to the timing diagram shown in FIG. 4, normal operations of the switching power supply unit of FIG. 1 will be described below, first for a case where no light-load determination signal LL has been issued.

Figure 4:
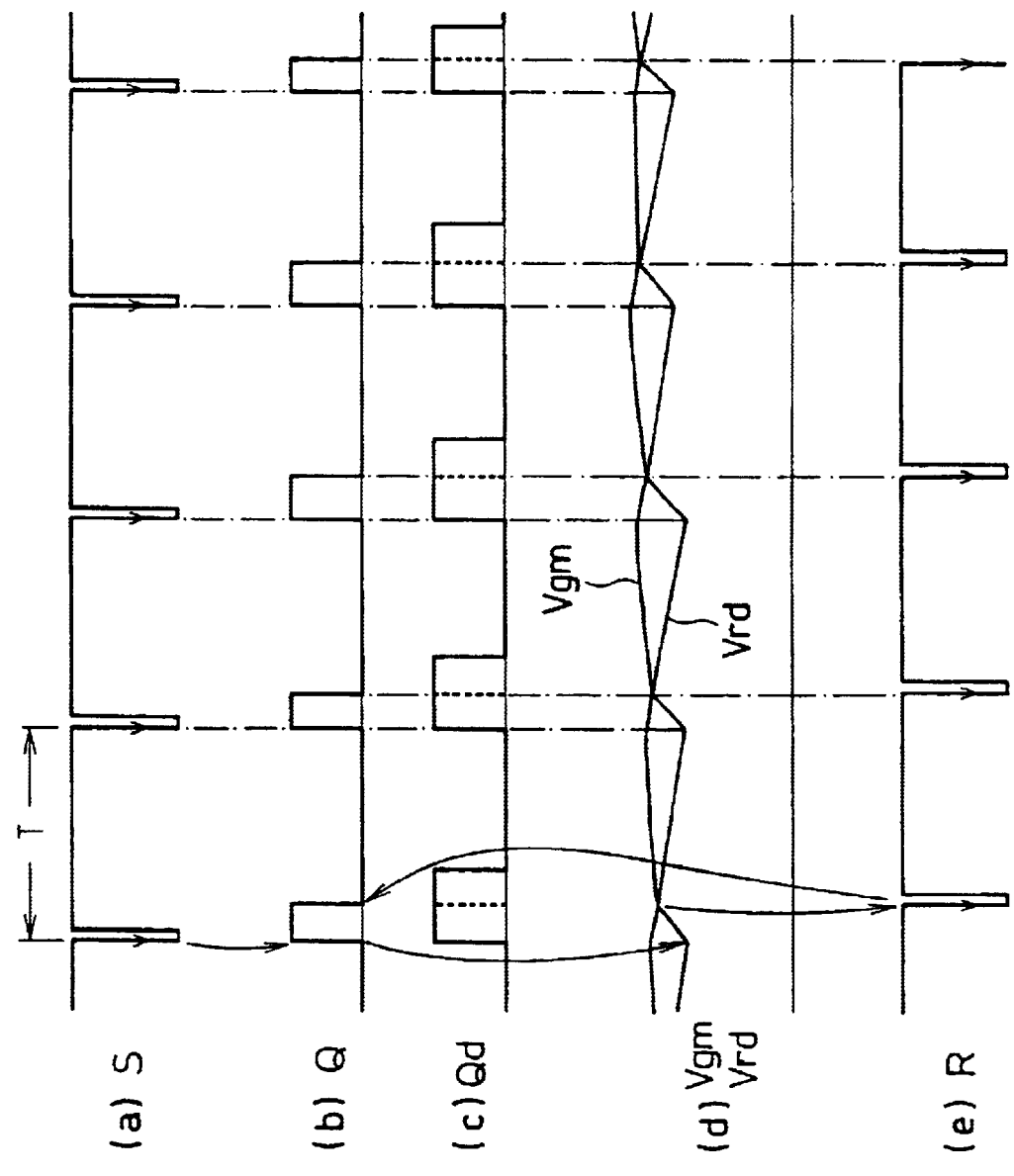
FIG. 4 is a timing diagram of the switching power supply unit of FIG. 1 when in use with an ordinary load.

Examples of a set signal S, a pulse signal Q outputted from a flip-flop FF, a delay pulse signal Qd, a GM output voltage Vgm, a detection voltage Vrd, and a reset signal R outputted from the comparator CP1 are shown in FIGS. 4 (a)–(e), respectively.

It is seen that the set signal S periodically falls at a constant period of T. The flip-flop FF is configured to be a fall-edge type trigger circuit. As a consequence, at the falling edges of the set signal S (shown with the arrows in FIG. 4), the flip-flop FF generates the pulse signal Q at HIGH level, provided that the reset signal R has been HIGH.

As the pulse signal Q goes HIGH, the n-type transistor 11 is turned on while the n-type transistor 12 is turned off via the driver 13, thereby causing the current Io to increase. The detection voltage Vrd also varies in the same way, as it is proportional to the current Io.

The pulse signal Q remains HIGH while the GM output voltage Vgm is larger than the detection voltage Vrd. As the detection voltage Vrd increases to the level of the GM output voltage Vgm, the reset signal R, i.e. the output of the comparator CP1, is inverted to LOW.

At a falling edge of the reset signal R, the Flip-flop FF is reset, pulling down the pulse signal Q LOW. In this case, the n-type transistor 11 is turned off and the n-type transistor 12 turned on, since no light-load determination signal LL has been generated, so that the pulse signal Q is the instruction signal given to the driver 13. This causes the current Io to decrease.

This procedure is repeated with the period T of the set signal S to generate a sequence of pulses Q having a width in accord with the magnitude of the load.

Figure 5:
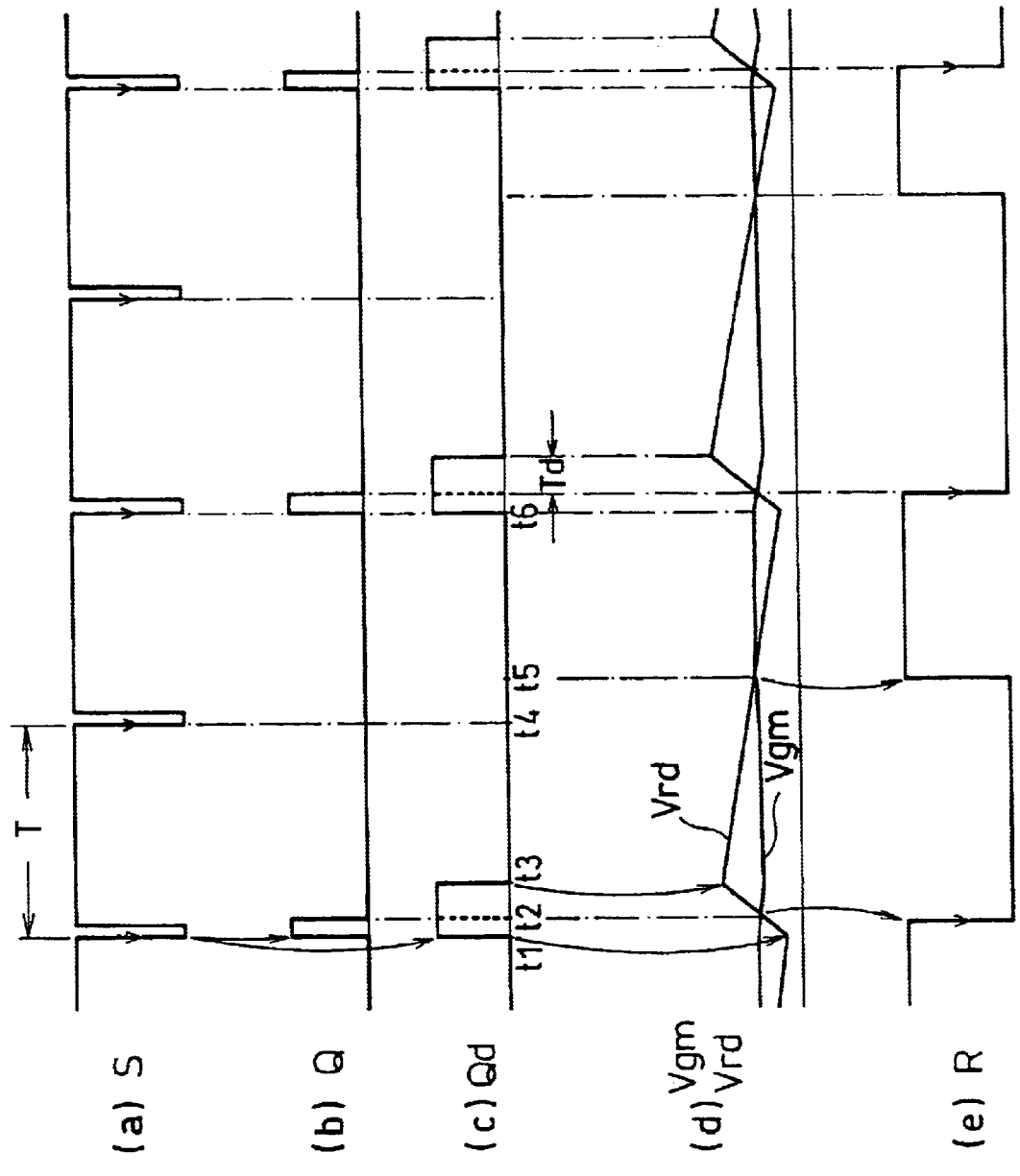
FIG. 5. is a timing diagram of the switching power supply unit of FIG. 1 operating under a light load.

Next, referring further to FIG. 5, there is shown a timing diagram of the switching power supply unit operating under a light-load, for which a light load determination signal LL is issued.

FIGS. 5(a)–(e) show a set signal S, a pulse signal Q, a delay pulse signal Qd, a GM output voltage Vgm and a detection voltage Vrd, and a reset signal R, respectively.

The set signal S also periodically falls at the constant period of T. The pulse signal Q goes HIGH at a falling edge t1 of the set signal S, provided that the reset signal R is HIGH then.

As the pulse signal Q goes HIGH, the n-type transistor 11 is turned on and the n-type transistor 12 is turned off via the driver 13, thereby causing the current Io, and hence the detection voltage Vrd, to increase.

The reset signal R remains HIGH while the GM output voltage Vgm is larger than the detection voltage Vrd. When the detection voltage Vrd increases to the level of the GM output voltage Vgm (at time t2), the output of the comparator CP1 is inverted, that is, the reset signal R is inverted (pulled down) to LOW.

The flip-flop FF is reset by a fall of the reset signal R, bringing the pulse signal Q LOW.

In this instance, however, since a light-load determination signal LL has been issued, the delay pulse signal Qd becomes an instruction signal to the driver 13. Consequently, the n-type transistor 11 remains to be turned on and the n-type transistor 12 turned off even after time t2 so long as the delay pulse signal Qd is HIGH. Hence, the detection voltage Vrd continues to increase.

As the delay pulse signal Qd goes down to the LOW level at time t3, the n-type transistor 11 is turned off and the n-type transistor 12 turned on, causing the detection voltage Vrd to decrease. The reset signal R remains LOW while the GM output voltage Vgm is smaller than the detection voltage Vrd.

The delay time Td is set such that the reset signal R remains LOW when the set signal S falls LOW at time t4 say in the next period. As a consequence, the flip-flop FF will not be set though it receives a set signal S, and remains reset.

As the current Io decreases, so that the detection voltage Vrd decreases below the GM output voltage Vgm (at time t5), the reset signal R again goes HIGH.

Under this condition, when the set signal S goes down (at time t6) in the next period, the pulse signal Q goes HIGH, since the reset signal R has been HIGH at time t6. Subsequently, the steps as described for the period from t1 through t6 are repeated.

In this way, when the load is light, the switching frequency of a switching circuit composed of n-type transistors 11 and 12 can be reduced to be held at a substantially constant low frequency by properly extending the pulse width of the instruction signal supplied to the driver 13, to thereby reduce the power loss and enhance the efficiency of the entire power supply unit during a light-load period.

It will be appreciated that this arrangement entails no burst noise and less ripples in the output voltage as compared with conventional power supply units. Further, the switching frequency of the power supply unit can be automatically altered to an appropriate low frequency when operating under a light load by simply adding the delay circuit 18 to a conventional power unit and assuming the same operations as for an ordinary load. It will be appreciated that even under a light load the various components of the unit can be used as they are, which allows easy configuration of the unit for use with a light load.

It has been shown in the timing diagram of FIG. 5 that the set signal S is switched every other period. However, the switching frequency of the set signal S is not limited to this instance. For example, it can be switched every 2 periods. This can be attained by simply regulating the increasing magnitude of the pulse width, or delay time Td, in the delay circuit 18.

It will be also appreciated that the driver 13 is adapted to turn off the transistor 12 of the ground if a backflow passes through it, based on a backflow detection signal, thereby stopping a wasteful discharge current in the unit under no or extremely small load.

It should be noted that the determination of the load being light or not can be easily obtained from the knowledge of the current flowing through the smoothing coil and the output level of the mutual-conductance amplifier under normal operating conditions, so that the determination of the status of the load can be easily attained as described above.

It will be also appreciated that widening the width in time of the pulse signal can be easily attained by means of a delay circuit by simply widening the width by a constant magnitude. In this case, the switching frequency is properly set in accordance with the magnitude of the load, since the pulse width is set inversely proportional to the output of the mutual-conductance amplifier and the current flowing through the smoothing coil.

Figure 6:
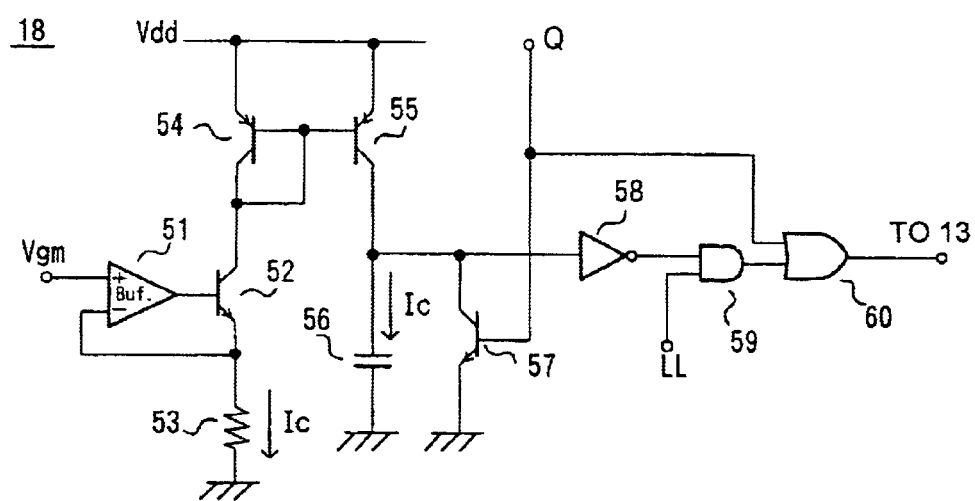
FIG. 6 is an alternative arrangement of the delay circuit 18.

FIG. 6 shows an alternative configuration of the delay circuit 18 in which an npn-type bipolar transistor (referred to as n-type bi-transistor) 52 and a resistor 53 are connected in the series between the collector of a pnp-type bipolar transistor (referred to as p-type bi-transistor) 54 and the ground. The GM output voltage Vgm and the voltage of the node of the resistor 53 and the emitter of the n-type bi-transistor 52 are coupled to the non-inverting and inverting input terminals, respectively, of a buffer 51 composed of an operational amplifier. The output of the buffer 51 is supplied to the base of the n-type bi-transistor 52. A p-type bi-transistor 54 and a p-type bi-transistor 55 are connected to a current mirror configuration. This p-type bi-transistor 55 and a condenser 56 are connected in series. An n-type bi-transistor 57, connected in parallel with the condenser 56, is driven by a pulse signal Q.

As the pulse signal Q goes LOW, the condenser 56 gets charged. The charging voltage of the condenser 56 is determined as threshold by an inverter 58. A logical product of the output of the inverter 58 and the light-load determination signal LL is performed in an AND circuit 59. A further logical product of the output of the AND circuit 59 and the pulse signal Q is performed in an OR circuit 60 to generate an instruction signal supplied to the driver 13.

In the delay circuit 18 shown in FIG. 6, a current Ic given by Vgm/R flows through the resistor 53, where R is the resistance of the resistor 53. A charging current Ic of the same magnitude as, or proportional to, the current Ic flows the condenser 56. Since the GM output voltage Vgm is substantially proportional to the current Io, the time for the charging voltage of the condenser 56 to reach the threshold voltage of the inverter 58 is proportional to the current Io. Thus, the smaller the current Io is, the larger is the delay time Td delayed by the delay circuit 18, since the delay time is inversely proportional to the current Io.

The power lost in the switching power supply unit attributed mainly to the switching loss that depends on the switching frequency and by the ohmic loss that depends on the output current and resistances involved in the unit. Therefore, given the components of the power supply unit and an anticipated load current, a preferred switching frequency of the unit may be determined for an improved efficiency.

In the delay circuit 18 shown in FIG. 6, the switching frequency may be adjusted closely to a preferred frequency in accordance with the output current by rendering the delay time Td to become inversely proportional to the output current Io using the output of the GM amplifier 16.

As an alternative embodiment of the switching power supply unit as described above, a thinning control circuit 18A may be used in place of the delay circuit 18 shown in FIG. 1. The thinning control circuit 18A receiving the pulse signal Q from the flip-flop FF is adapted to pass the pulse signal Q as it is, or pass the pulses after thinning them at a predetermined rate, depending on whether a light-load determination signal LL is received or not. That is, if the load is light, the pulse signal Q is thinned before it is outputted, but otherwise the pulse signal is not thinned. The thinning rate may be such that every other pulse of the input pulse signal Q is thinned. The pulse signal Q may be thinned at another rate. The rest of the unit can be the same as the one shown in FIG. 1. The thinning control circuit 18A provides the same effect to the switching power supply unit as the delay circuit 18.

Figure 7:
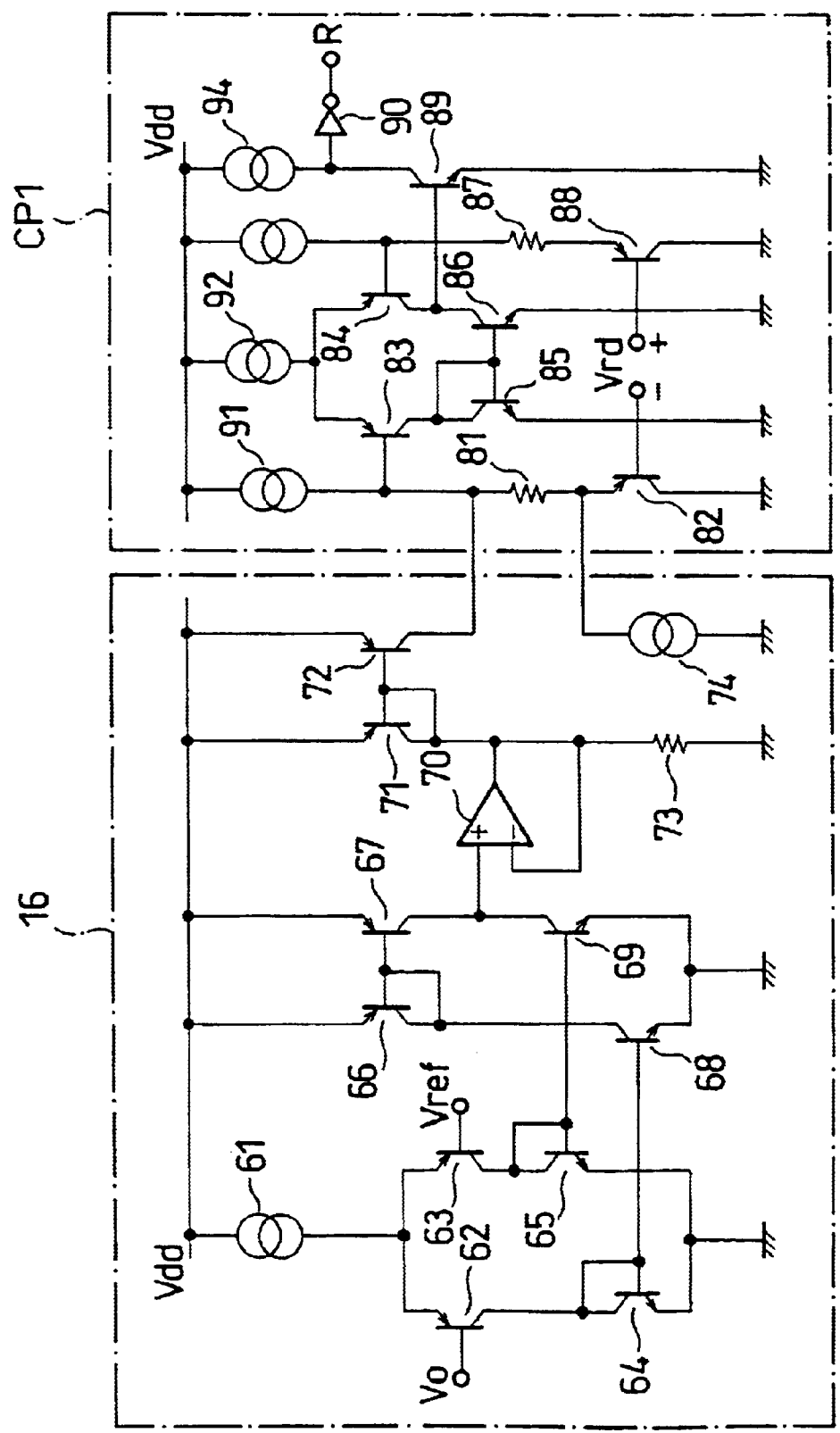
FIG. 7 is a specification circuit diagram of GM amplifier 16 connected to a comparator CP1.
Figure 8:
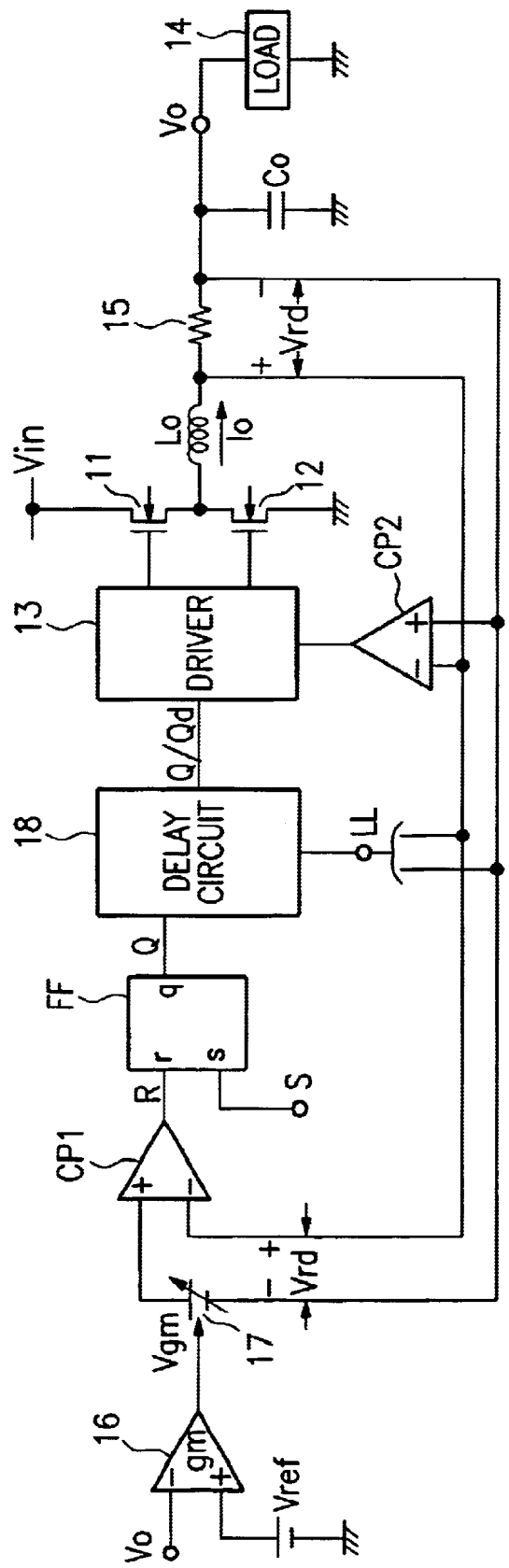
FIG. 8 is an overall schematic view of a switching power supply illustrating the light-load determination signal LL generating from GM output voltage Vgm.
Figure 9:
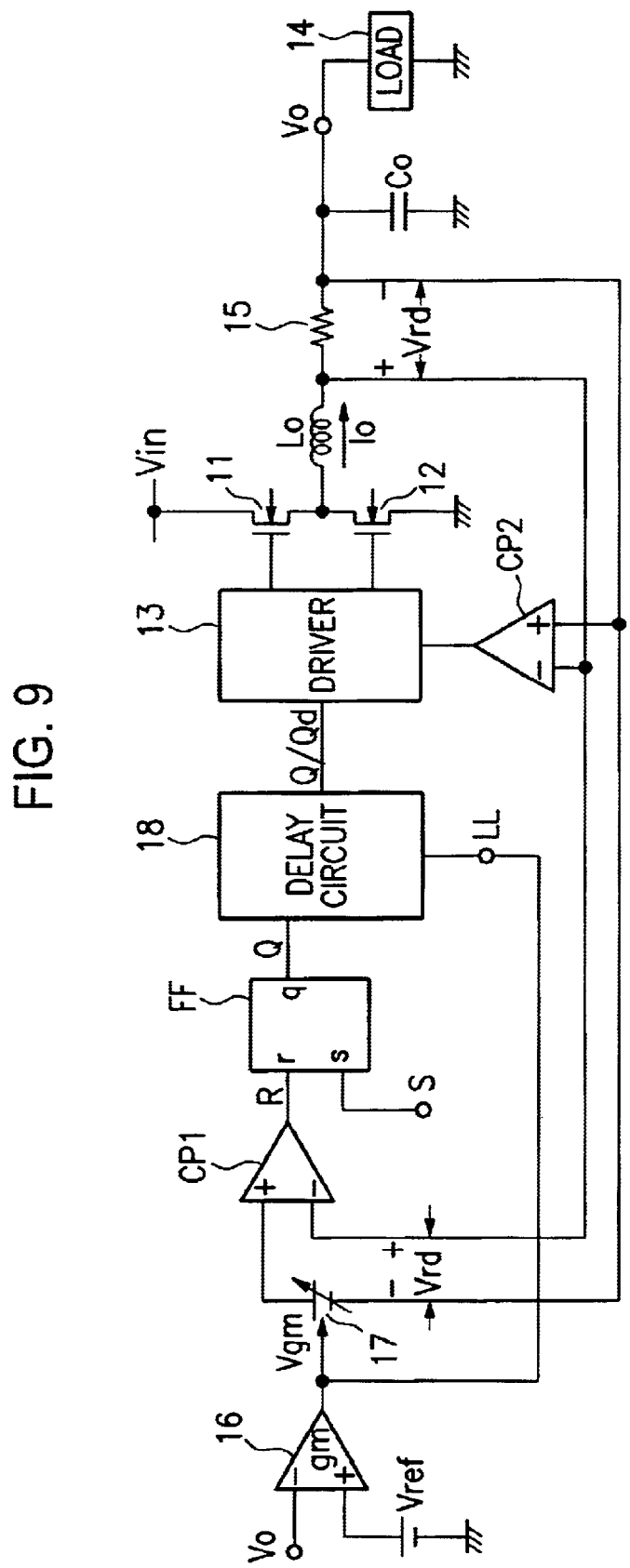
FIG. 9 is an overall schematic view of a switching power supply illustrating the light-load determination signal LL generating from Vgm and Vrd.

FIG. 7 shows specific arrangements of the GM amplifier 16 and the comparator CP1. As shown in FIG. 7, the GM amplifier 16 includes a power supply 61 for generating an output associated with the difference between the output voltage Vo and a reference voltage Vref, a p-type bi-transistor 63 having a base connected to the reference voltage Vref, and a p-type bi-transistor 62 having a base connected to the output voltage Vo. The bi-transistors 62 and 63 are connected in a differential relationship, as shown in FIG. 7. Further, n-type bi-transistors 64, 65, 68, and 69, p-type bi-transistors 66, 67, 71, and 72, an operational amplifier 70, a resistor 73, and a current source 74 are connected as shown in FIG. 7.

With the GM amplifier 16 thus configured, a current is generated in proportion to the difference between the reference voltage Vref and the output voltage Vo. This current is supplied to the comparator CP1 in the next stage.

The comparator CP1 is also supplied with an offset voltage associated with the output current of the GM amplifier 16 and a detection voltage Vrd to be compared with the offset voltage. An offsetting resistor 81, a constant current sources 91, 92, 93, and 94, p-type bi-transistors 82, 83, 84, and 88, n-type bi-transistors 85, 86, and 89, and an inverter 90 are connected as shown.

In this comparator CP1, the GM output voltage Vgm generated across the resistor 81 is compared with the detection voltage Vrd that is proportional to the current Io. If the GM output voltage Vgm is larger than the detection voltage Vrd, a HIGH level reset signal R is output.

Although the flip-flop FF has been described to flip at a falling edge of the signal, it may be formed to flip at LOW level in a latch circuit configured to prioritize resetting operations.

What is claimed is:

1. A switching power supply unit, comprising:
    a switching circuit for switching on and off an input voltage in response to an instruction signal received;
    a pulse signal generator for generating a periodic pulse signal having a duty factor in accord with the difference between a reference voltage and a feedback voltage associated with an output voltage which is a switching output of said switching circuit smoothed by a smoothing coil and an output condenser; and
    a delay-control unit receiving said pulse signal from said pulse signal generator and a light-load determination signal indicating whether the load connected to the switching power supply unit is light or not to output as said pulse signal said instruction signal as it is when said load is not light, but otherwise output said pulse signal after widening the pulse width thereof.

2. The switching power supply unit according to claim 1, wherein said pulse signal generator generates said pulse signal having a duty factor based on
    a difference signal associated with the difference between said reference voltage and said feedback voltage associated with the current flowing through said smoothing coil.

3. The switching power supply unit according to claim 2, wherein said pulse signal generator comprises:
    a mutual conductance amplifier receiving the voltage difference between said reference voltage and feedback voltage associated with said output voltage to amplify said voltage difference:
    a comparator for comparing an error voltage associated with the output of said mutual conductance amplifier and a detection voltage associated with the current flowing through said smoothing coil; and
    a flip-flop circuit receiving a periodic set signal having a constant period and the output of said comparator, said flip-flop configured to be set by the set signal when the output of said comparator is at a predetermined state and reset when the output of said comparator changes from said predetermined state to another state to generate said pulse signal.

4. The switching power supply unit according to claim 3, wherein said light-load determination signal is generated based on an error voltage associated with the output of said mutual conductance amplifier.

5. The switching power supply unit according to claim 4, wherein the width of said pulse signal is widened in inverse proportion to said error voltage associated with the output of said mutual conductance amplifier.

6. The switching power supply unit according to claim 2, wherein said light-load determination signal is generated based on a current detection signal associated with the current flowing through said smoothing coil.

7. The switching power supply unit according to claim 6, wherein the width of said pulse signal is widened in said delay-control unit by a constant time.

8. The switching power supply unit according to claim 2, wherein the width of said pulse signal is widened in said delay-control unit by a constant time.

9. The switching power supply unit according to claim 1, wherein said switching circuit has transistor switches connected in series therewith and driven by said instruction signal such that said switching output is provided at the node of said switching circuit and transistor switches:

a driver provided between said delay-control unit and said switching circuit, and adapted to drive said series transistor switches based on said instruction signal outputted from said delay-control unit; and a comparator adapted to determine the direction of the current flowing through said smoothing coil and supply a backflow detection signal to said driver when said direction is backward, said switching circuit adapted to switch off a transistor flowing said backflow, and wherein said driver turns off one of said transistor switches through which a backflow current flows.

10. The switching power supply unit according to claim 1, wherein said light-load determination signal is generated based on a current detection signal associated with the current flowing through said smoothing coil.

11. The switching power supply unit according to claim 10, wherein the width of said pulse signal is widened in said delay-control unit by a constant time.

12. The switching power supply unit according to claim 1, wherein the width of said pulse signal is widened in said delay-control unit by a constant time.

13. A switching power supply unit, comprising:

a switching circuit for switching on and off an input voltage in response to an instruction signal received:

a pulse signal generator for generating a first periodic pulse signal having a duty factor in accord with the difference between a reference voltage and a feedback voltage associated with an output voltage which is a switching output of said switching circuit smoothed by a smoothing coil and an output condenser; and a signal-thinning control unit receiving said first periodic pulse signal and a light-load determination signal indicating whether the load connected to the switching power supply unit is light or not to output as said instruction signal said first periodic pulse signal when said load is not light, but otherwise output a second periodic pulse signal that are generated by thinning said first periodic pulse signal.

14. The switching power supply unit according to claim 13, wherein said pulse signal generator generates said first pulse signal having a duty factor based on a difference signal associated with the difference between said reference voltage and said feedback voltage associated with said output signal, and a current detection signal associated with the current flowing through said smoothing coil.

15. The switching power supply unit according to claim 14, wherein said pulse signal generator comprises:

a mutual conductance amplifier receiving said reference voltage and feedback voltage associated with said output voltage to amplify said voltage difference;

a comparator for comparing an error voltage associated with the output of said mutual conductance amplifier and a detection voltage associated with the current flowing through said smoothing coil; and a flip-flop circuit receiving a periodic set signal having a constant period and the output of said comparator, said flip-flop configured to be set by a set signal when the output of said comparator is at a predetermined state and reset when the output of said comparator changes from said predetermined state to another state to generate said first pulse signal.

16. The switching power supply unit according to claims 13, wherein said switching circuit has transistor switches connected in series therewith and driven by said instruction signal such that said switching output is provided at the node of said switching circuit and transistor switches;

a driver provided between said signal-thinning control unit and switching circuit, and adapted to drive said series transistor switches based on said instruction signal outputted from said signal-thinning control unit; a comparator adapted to determine the direction of the current flowing through said smoothing coil and supply a backflow detection signal to said driver when said direction is backward, said switching circuit adapted to switch off a transistor flowing said backflow, and wherein said driver turns off one of said transistor switches through which a backflow current flows.

17. The switching power supply unit according to claim 13, wherein said light-load determination signal is generated based on a current detection signal associated with the current flowing through said smoothing coil.

18. A switching power supply unit, comprising:

a switching circuit for switching on and off an input voltage in response to an instruction signal received; and a pulse signal generator for generating a constant periodic pulse signal having a duty factor in accord with the difference between a reference voltage and a feedback voltage associated with an output voltage which is a switching output of the switching circuit smoothed by a smoothing coil and an output condenser, and for outputting said instruction signal with its pulse signal width controlled basing on a load level of said switching power supply; and a delay-control unit receiving said pulse signal from said pulse signal generator and a load-condition determination signal to output said instruction signal after widening the pulse width of said pulse signal in accord with the load-condition.

* * * * *